(12) United States Patent
Wu et al.

(10) Patent No.: US 10,910,199 B2
(45) Date of Patent: Feb. 2, 2021

(54) METHOD OF CONTROLLING AN ADJUSTABLE NOZZLE AND METHOD OF MAKING A SEMICONDUCTOR DEVICE

(71) Applicant: TAIWAN SEMICONDUCTOR MANUFACTURING COMPANY, LTD., Hsinchu (TW)

(72) Inventors: Wei-Ching Wu, New Taipei (TW); Wen-Long Lee, Hsinchu (TW); Ding-I Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 111 days.

(21) Appl. No.: 15/948,379

(22) Filed: Apr. 9, 2018

(65) Prior Publication Data

US 2018/0226224 A1    Aug. 9, 2018

Related U.S. Application Data

(62) Division of application No. 13/328,474, filed on Dec. 16, 2011, now Pat. No. 9,941,100.

(51) Int. Cl.
  *C23C 16/52*     (2006.01)
  *H01J 37/32*     (2006.01)
  *C23C 16/455*    (2006.01)

(52) U.S. Cl.
  CPC .... *H01J 37/3244* (2013.01); *C23C 16/45563* (2013.01); *C23C 16/45589* (2013.01); *C23C 16/52* (2013.01)

(58) Field of Classification Search
  None
  See application file for complete search history.

(56) References Cited

U.S. PATENT DOCUMENTS

| 6,486,081 B1* | 11/2002 | Ishikawa | C23C 16/401 |
| | | | 438/787 |
| 2007/0037397 A1* | 2/2007 | Lu | H01J 37/321 |
| | | | 438/710 |

(Continued)

OTHER PUBLICATIONS

"In". Collins Dictionary Online. Retrieved on Apr. 26, 2020 https://www.collinsdictionary.com/dictionary/english/in (Year: 2020).*

(Continued)

*Primary Examiner* — Jose I Hernandez-Kenney
(74) *Attorney, Agent, or Firm* — Hauptman Ham, LLP

(57) ABSTRACT

A method of controlling a position of an adjustable nozzle includes depositing a film on a surface of a wafer. The method includes measuring a thickness profile of the surface of the wafer. The method includes comparing the measurement of the thickness profile with a reference value using a control unit. The method includes transmitting a control signal to the adjustable nozzle to alter the position of the adjustable nozzle based on the result of the comparison. The adjustable nozzle includes a base having a hollow center portion for conducting gas, the base configured for connection to a gas source. The adjust nozzle includes a tip coupled to the base and having an opening for conducting gas from the base to the exterior of the nozzle, wherein the base is configured for pivoting about a longitudinal axis of the base in response to the control signal.

20 Claims, 7 Drawing Sheets

(56) References Cited

U.S. PATENT DOCUMENTS

| | | | |
|---|---|---|---|
| 2007/0134821 A1* | 6/2007 | Thakur | C23C 16/45546 438/5 |
| 2008/0115728 A1* | 5/2008 | Matsuda | H01J 37/32009 118/723 R |
| 2011/0303362 A1* | 12/2011 | Saito | C23C 16/45563 156/345.33 |

OTHER PUBLICATIONS

"Include". Collins Dictionary Online. Retrieved on Apr. 26, 2020 https://www.collinsdictionary.com/dictionary/english/include (Year: 2020).*

* cited by examiner

METHOD OF CONTROLLING AN ADJUSTABLE NOZZLE AND METHOD OF MAKING A SEMICONDUCTOR DEVICE

PRIORITY CLAIM

The present application is a divisional of U.S. application Ser. No. 13/328,474, filed Dec. 16, 2011, which is incorporated herein by reference in its entirety.

BACKGROUND

A high density plasma (HDP) chemical vapor deposition (CVD) chamber is an apparatus for forming a film on a wafer. The wafer is supported by a carrier and has a surface exposed to the interior of the HDP CVD chamber. Conventional HDP CVD chambers have nozzles which spray gas into an electrically induced plasma region in the chamber interior. The plasma then reacts to form a film on the wafer. The nozzles of a conventional HDP CVD chamber are spaced about the chamber above a top surface of the wafer.

The film formed on the wafer using conventional techniques has significant variation in thickness across the surface of the wafer. Variations in thickness impacts the ability to form an intended semiconductor device using the wafer. For example, a relatively thicker portion of the film will take longer to etch, the result being either over-etching thinner portions of the film or under-etching thicker portions. Also relatively thinner portions of the film are removed faster during chemical and mechanical polishing (CMP), resulting in either damaging layers under the film if the thicker portions of the film are removed or a rougher surface if CMP stops once the thin portions of the film are removed.

Thickness profiles for films deposited on wafers are evaluated using mean thickness, standard deviation of the thickness across the wafer surface and thickness range. These values are determined by taking thickness measurements at various locations across the surface of the wafer. The more uniform the thickness profile, the more likely the wafer will produce a usable device.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DESCRIPTION

The following disclosure provides many different embodiments, or examples, for implementing different features of the invention. Specific examples of components and arrangements are described below to simplify the present disclosure. These are of course, merely examples and are not intended to be limiting.

Figure 1:
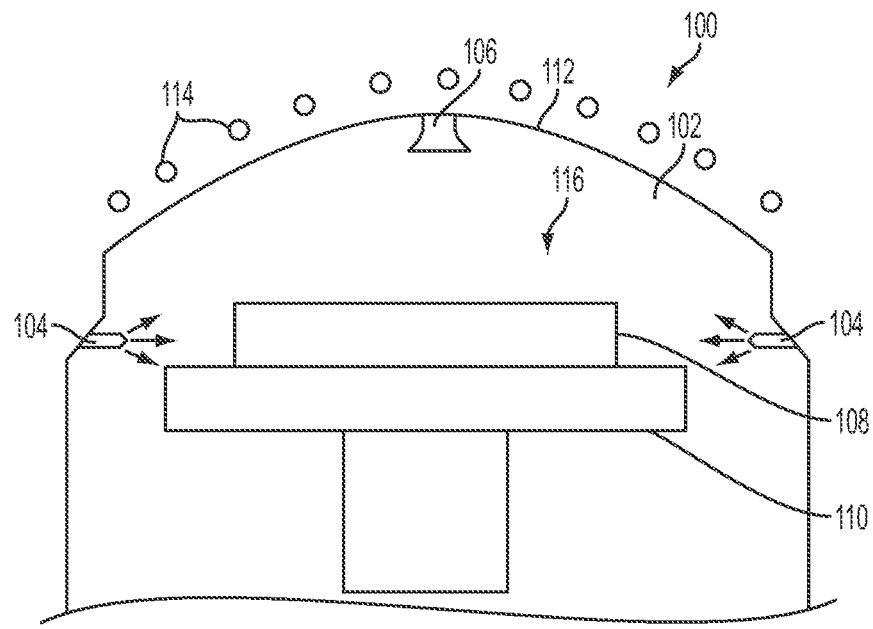
FIG. 1 is a side view diagram of a high density plasma chemical vapor deposition (HDP CVD) chamber according to some embodiments.
Figure 8:
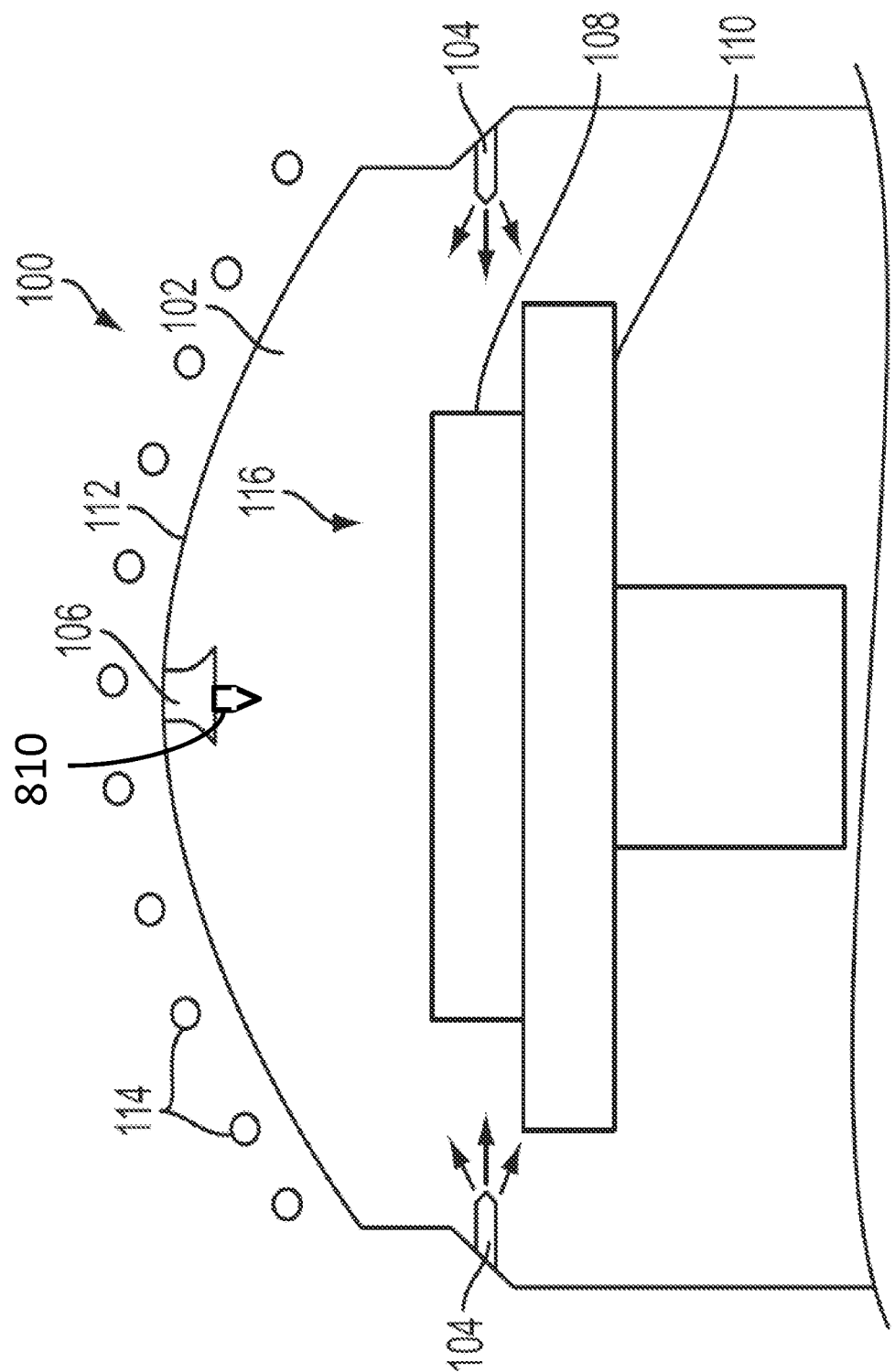
FIG. 8 is a side view diagram of a HDP CVD chamber according to some embodiments.

FIG. 1 is a side view diagram of an example HDP CVD chamber 100 having a wafer 108 supported on a carrier 110 disposed within the chamber interior 102. An electrical field is induced in the chamber interior 102 using an inductive coil 114. HDP CVD chamber 100 has nozzles 104 located around the periphery of chamber interior 102 for spraying gas into chamber interior 102. HDP CVD chamber 100 has a hemispherical top portion 112 situated above wafer 108 to keep the gas sprayed by nozzles 104 in HDP CVD chamber interior 102. Hemispherical top portion 112 has a baffle 106 to help redirect the plasma formed in chamber interior 102 toward wafer 108 to increase deposition speed and/or efficiency. In some embodiments, baffle 106 is equipped with a stationary nozzle or an adjustable nozzle, e.g., adjustable nozzle 810 in FIG. 8. In some embodiments, nozzles 104 are situated above a top surface 116 of the wafer.

Figure 6:
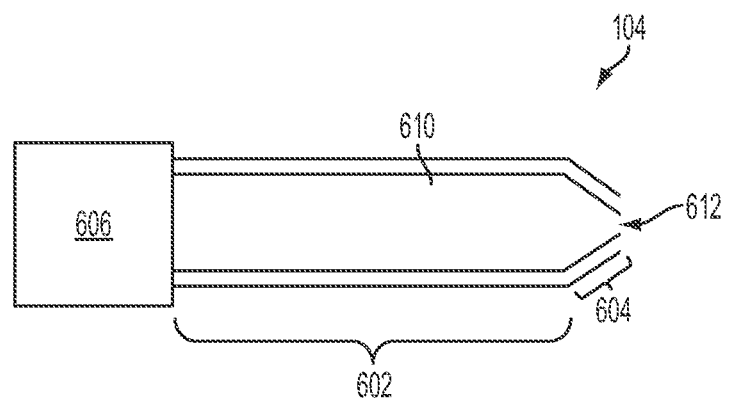
FIG. 6 is a side view diagram of a nozzle according to some embodiments.

In the embodiment of FIG. 6, a hollow cylindrical nozzle 104 has a base 602 and a tip 604. Base 602 is connected on one end to a gas source 606 and to tip 604 on the other end. A hollow interior 610 conducts fluid in the form of a gas from the gas source to tip 604. Tip 604 has an opening 612 to spray the gas into the HDP CVD chamber 100 (FIG. 1). In some embodiments, opening 612 has a circular shape. In other embodiments, opening 612 has a slit shape oriented orthogonal to a longitudinal axis of base 602. In still other embodiments, opening 612 is more than one opening formed in tip 604.

Figure 2:
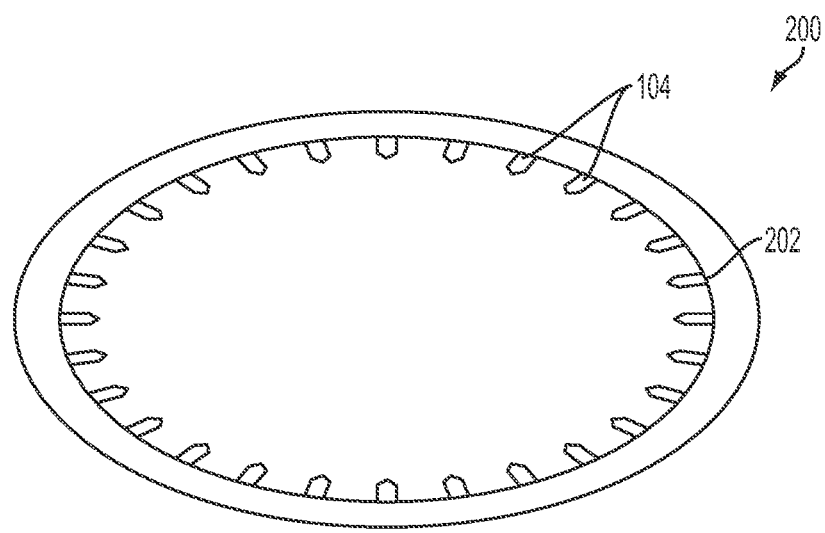
FIG. 2 is a diagram of a ring-shaped nozzle arrangement for an HDP CVD chamber according to some embodiments.

FIG. 2 is a diagram of an example nozzle arrangement in which nozzles 104 are distributed in a ring-shaped arrangement 200 around an inner surface 202 of HDP CVD chamber 100. In other embodiments, nozzles 104 are arranged in different shapes. In the embodiment of FIG. 2, nozzles 104 are spaced periodically around inner surface 202. In other embodiments, nozzles 104 are grouped together into a grouping of nozzles with larger spacing between groups. Each nozzle 104 is adjustable. In other embodiments, at least one nozzle 104 is stationary. In still other embodiments, only one nozzle 104 in the grouping of nozzles is adjustable.

Figure 3:
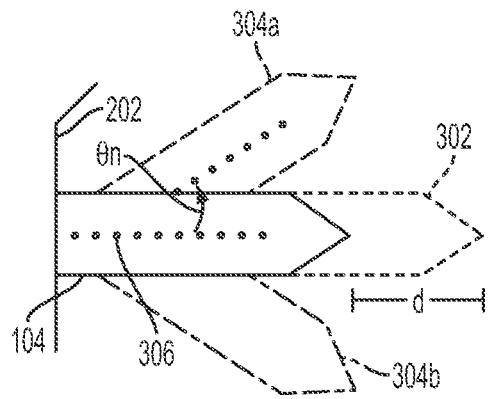
FIG. 3 is a diagram of a side view of an adjustable nozzle according to some embodiments.

In the embodiment of FIG. 3, nozzle 104 is adjustable to be able to pivot about a longitudinal axis 306 extending through hollow interior 610 (FIG. 6) of nozzle 104. Nozzle 104 is able to pivot upward as shown by dash outline 304a or downward as shown by dash outline 304b. In some embodiments, nozzle 104 is pivoted using a piezoelectric motor coupled to the base 602. In other embodiments, nozzle 104 is pivoted using a servo motor, stepper motor, pneumatic devices or other suitable movement inducing apparatus. The amount of pivot is represented by angle, en, which is the angle between the longitudinal axis of nozzle 104 extending perpendicular from an inner surface 202 (FIG. 2) of a nozzle arrangement prior to pivoting and the longitudinal axis of the pivoted nozzle. For example, FIG. 3 shows angle, en, between solid outline nozzle 104 and dashed outline nozzle 304a. In the embodiment of FIG. 3, the maximum pivot angle is about plus or minus 15-degrees.

Nozzle 104 is also configured to translate (or extend) along the longitudinal axis as shown by dotted outline 302. In some embodiments, nozzle 104 is configured to extend by using a piezoelectric motor coupled to the base 602. In other embodiments, nozzle 104 is configured to extend by using a servo motor, stepper motor, pneumatic devices or other suitable movement inducing apparatus. The amount of translation is represented by distance, d, which is the distance between the opening of the nozzle tip prior to translation and the opening of the nozzle tip after translation. For example, FIG. 3 shows distance, d, between solid nozzle outline 104 and dotted outline nozzle 302. The ability to pivot and translate nozzle 104 allows the direction of gas sprayed by the nozzle to be adjusted to provide more uniform thickness of a film deposited on wafer 108 (FIG. 1). In the embodiment of FIG. 3, the nozzle length is ranges from about 0.85 inches to about 1.76 inches.

In an embodiment, pivot angle, en, and distance, d, are determined using a feedback control arrangement 400. Feedback control system 400 includes HDP CVD chamber 402, similar to HDP CVD chamber 100 (FIG. 1), which also measures the thickness profile of wafer 108 following the film deposition process. The thickness profile of wafer 108 is measured using a metrology tool to determine the thickness of the deposited film at various locations across the surface of wafer 108. The thickness profile data is then sent to a control unit 404. In an embodiment, control unit 404 has the structure of FIG. 7.

Figure 7:
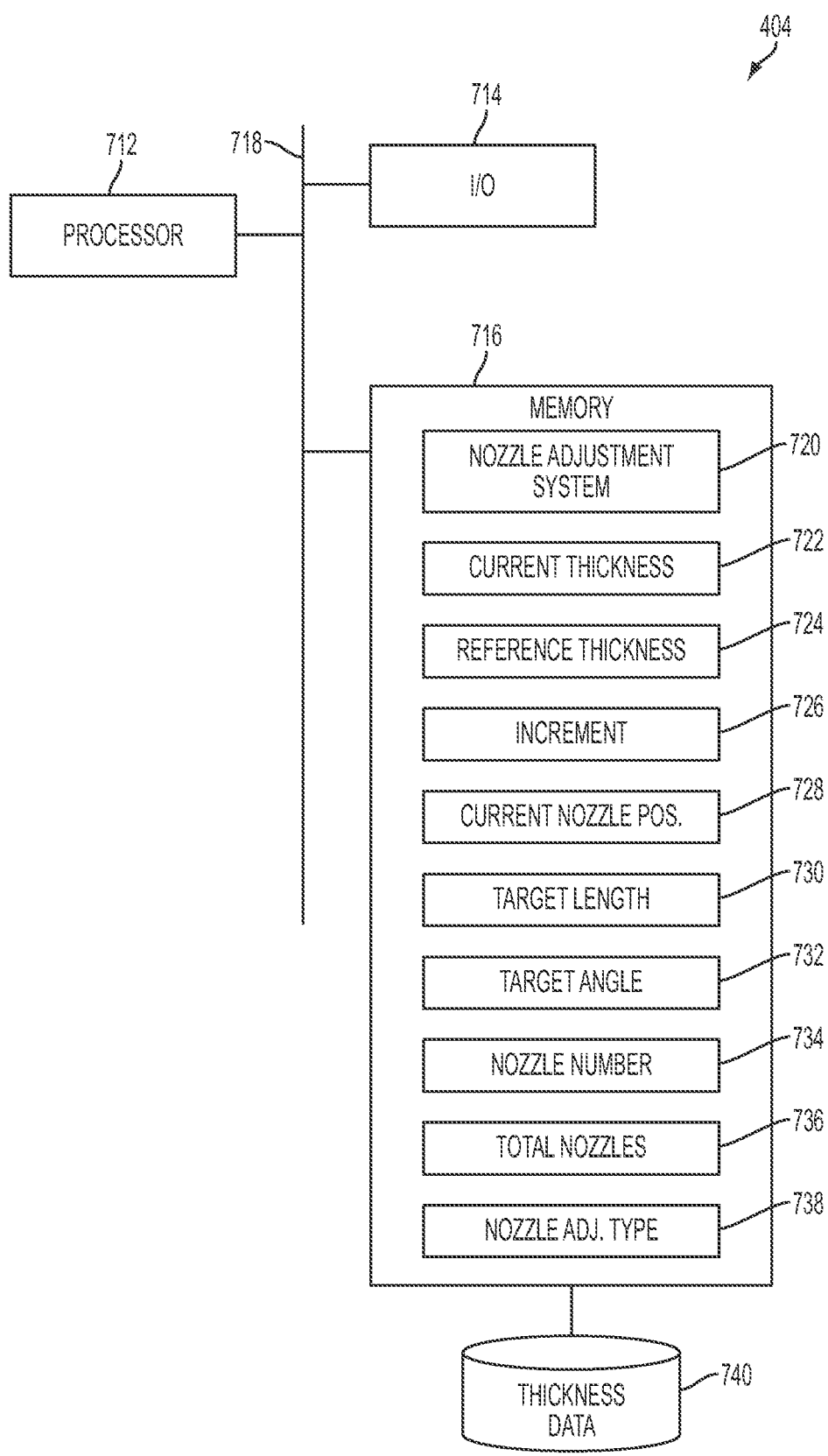
FIG. 7 is a schematic diagram of a control unit for use in the feedback control arrangement of FIG. 4.

FIG. 7 is a schematic diagram of a control unit 404. Control unit 404 includes a processor 712 configured to execute a set of instructions to cause the processor to perform calculations and comparisons between parameters. Processor 712 is connected to an input/output (I/O) device 714 by a bus 718 or similar mechanism. I/O device 714 is configured to receive signals from the HDP CVD chamber 402 and is configured to transmit control signals to an adjustable nozzle 406. Processor 712 is also connected to a memory 716 by bus 718.

Figure 4:
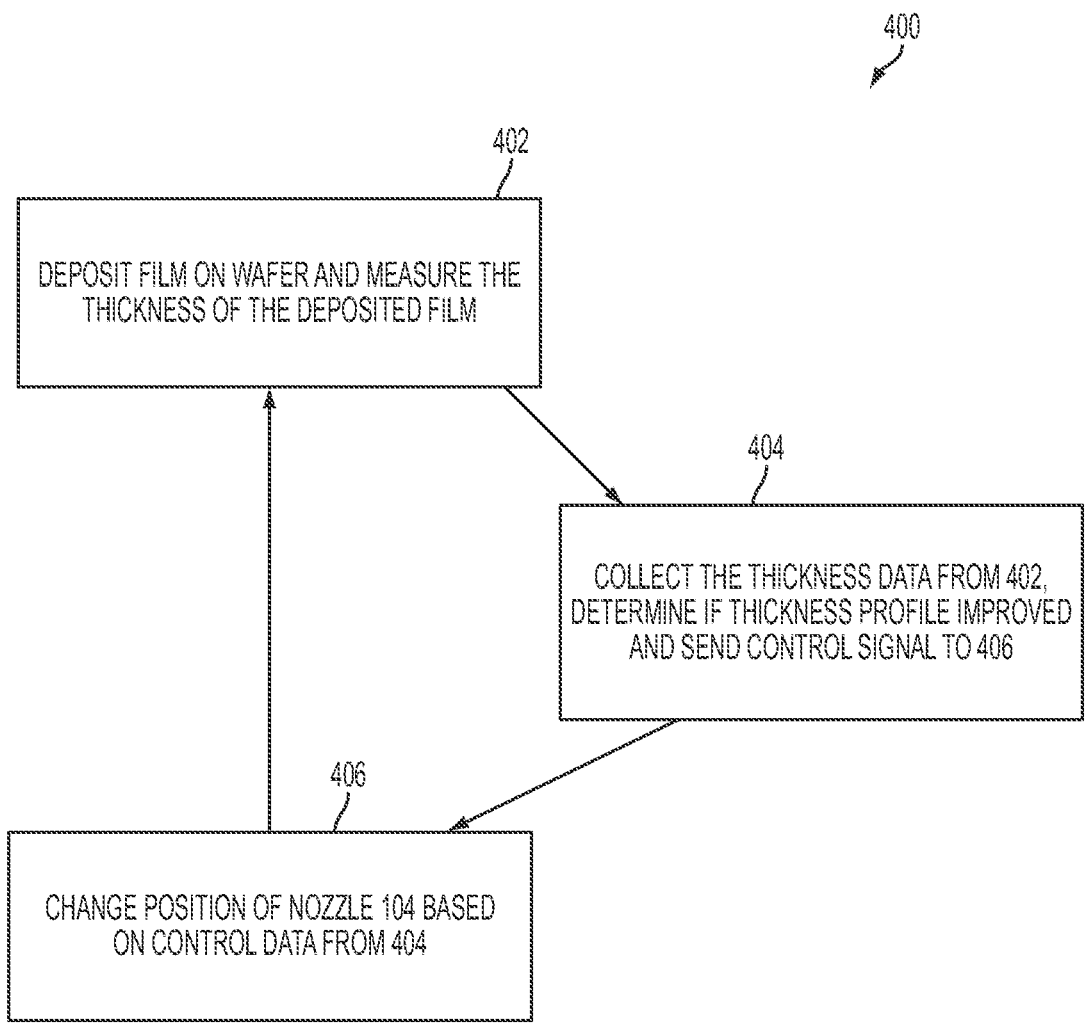
FIG. 4 is a schematic diagram of a feedback control arrangement for determining a nozzle position according to some embodiments.

Memory 716 stores parameters used in the calculations and comparisons performed by processor 712. Memory 716 includes a set of instructions comprising a nozzle adjustment system 720 configured to provide instruction for the calculations and comparisons performed by processor 712. Memory 716 stores several parameters to control the positioning of the adjustable nozzle 406 (FIG. 4). Memory 716 is configured to store a current thickness range 722 which is a measure of the uniformity of the thickness profile of a wafer most recently processed. Memory 716 is configured to store a reference thickness range 724 which is an updatable parameter which provides a basis for comparison for the current thickness range 722. At the beginning of the control cycle, reference thickness range 724 is set to a predetermined value to erase any data stored for the parameter from an earlier control cycle. In at least some embodiments, the predetermined value is a maximum value. Memory 716 is configured to store an increment 726 which is an amount of movement of the adjustable nozzle 406 after each control cycle. Memory 716 is configured to store a current nozzle position 728 which is the orientation of the adjustable nozzle 406 including length and angle (as well as rotation or any other nozzle movement parameters). Memory 716 is configured to store a target nozzle length 730 which is a length of the current nozzle position at which the highest thickness uniformity is achieved. Memory 716 is configured to store a target nozzle angle 732 which is an angle of the current nozzle position at which the highest thickness uniformity is achieved. Memory 716 is configured to store a nozzle number 734 which is an identification number associated with each adjustable nozzle 406. In at least some embodiments, each adjustable nozzle 406 is identified by a nozzle identifier. Memory 716 is configured to store a total nozzles 736 which is an overall number of adjustable nozzles controlled by control unit 404 for each HDP CVD chamber 402 (FIG. 4).

Figure 5A:
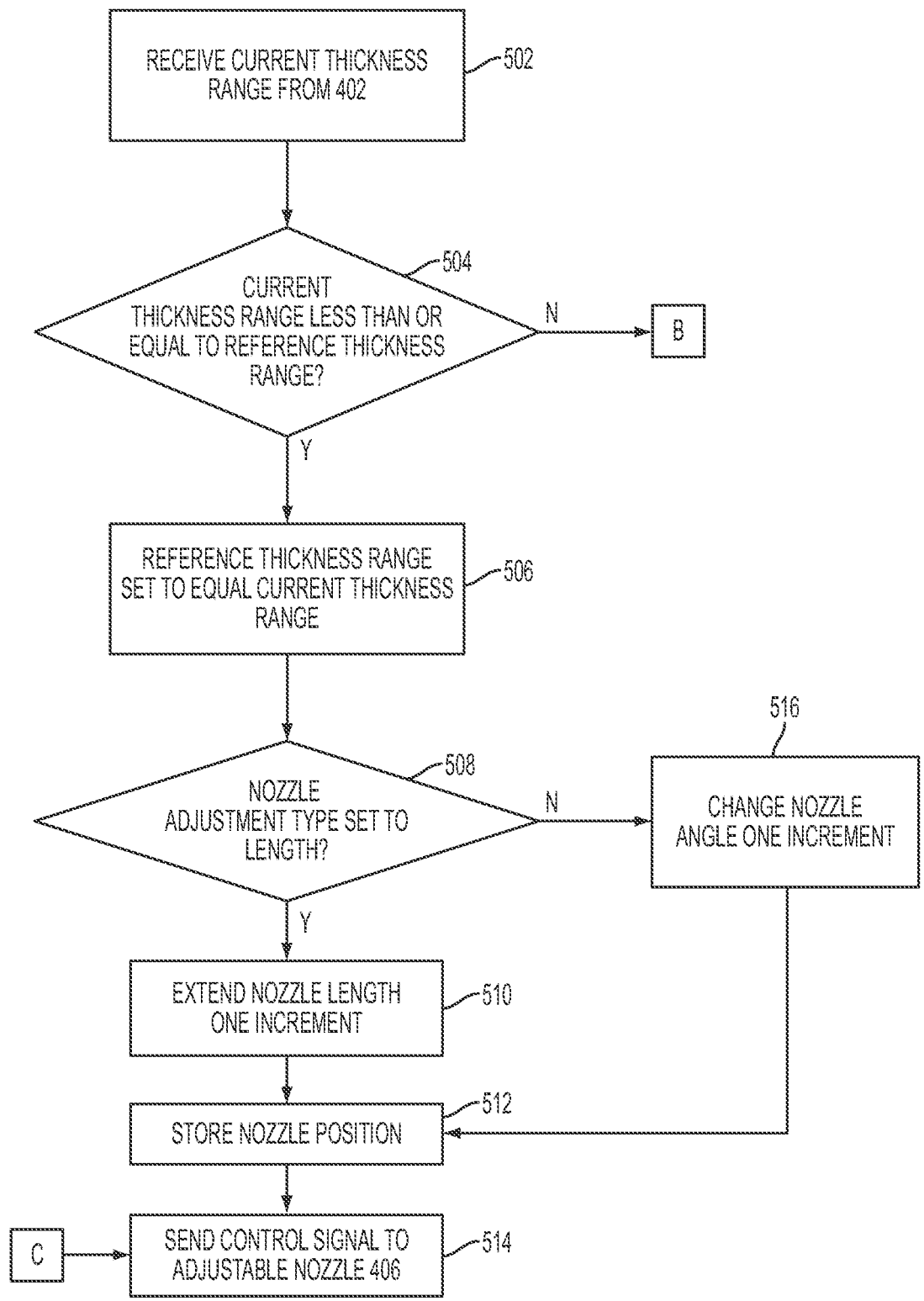
FIGS. 5A and 5B are a flow chart of a process of determining a nozzle position according to some embodiments.
Figure 5B:
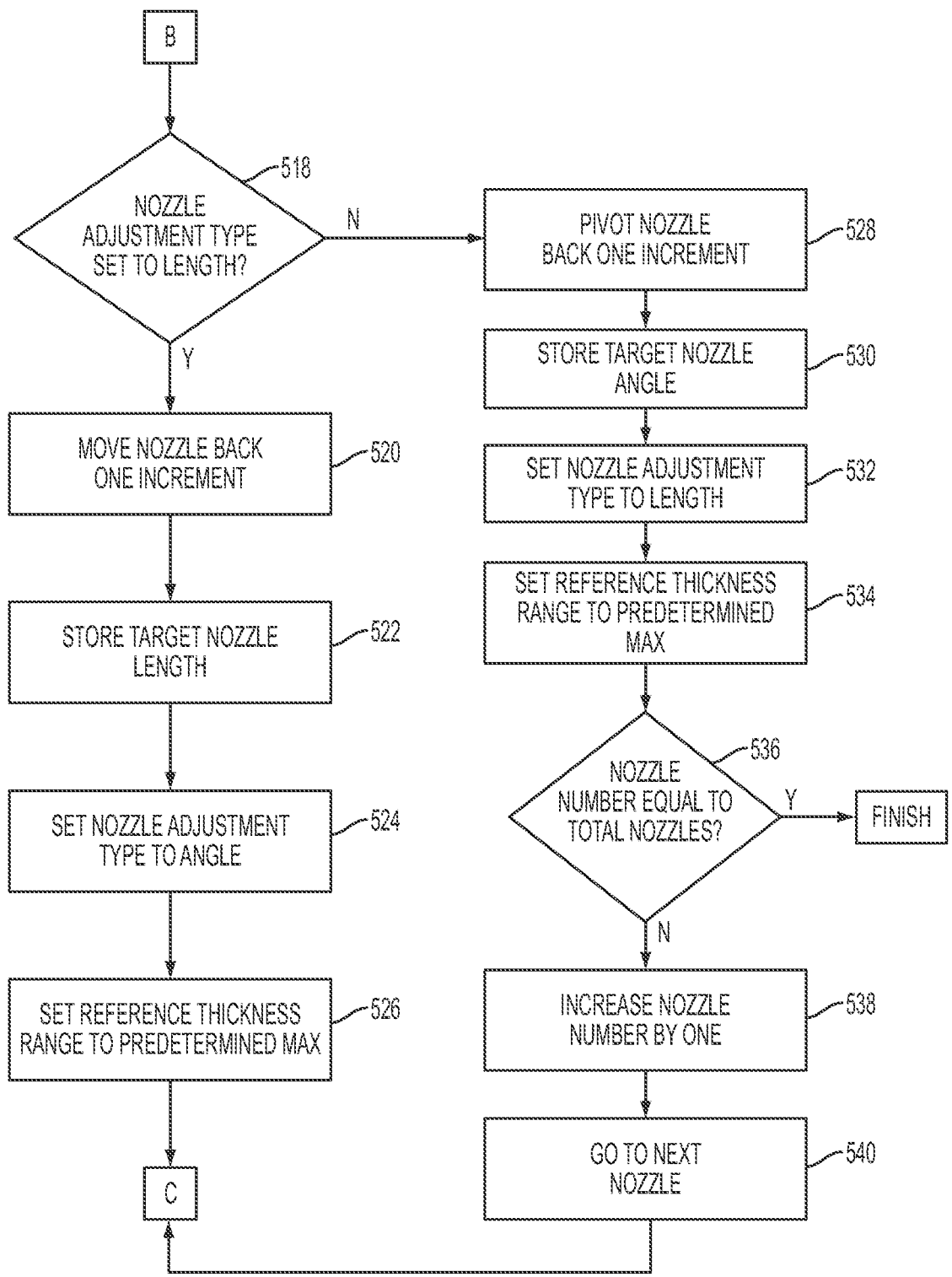

Memory 716 is configured to store a nozzle adjustment type 738 which is a value to inform control unit 404 (FIG. 4) which type of movement is currently being controlled. In the embodiment of FIGS. 5A-5B, the nozzle adjustment type is either length or angle. In other embodiments, the nozzle adjustment type includes other types of movement such as rotation. Rotation about the longitudinal axis 306 (FIG. 3) is advantageous to the control cycle if the shape of opening 612 (FIG. 6) is asymmetrical. In the embodiment of FIGS. 5A-5B, a length nozzle adjustment type is controlled first. In other embodiments, an angle nozzle adjustment type is controlled first. In still other embodiments, the angle nozzle adjustment type and the length nozzle adjustment type are controlled simultaneously. In further embodiments, the nozzle adjustment type includes only one of length or movement. One of ordinary skill in the art would recognize parameters can be added or removed depending on the design of the adjustable nozzle 406 and the control unit 404.

In some embodiments, memory 716 includes a datastore 740 configured to store thickness data. Datastore 740 allows tracking of the control cycles and evaluation of the performance of HDP CVD chambers. In other embodiments, control unit 404 includes different or additional elements as recognizable by one of ordinary skill in the art.

In the embodiment of FIG. 4, control unit 404 receives the thickness profile data, through I/O device 714 (FIG. 7), and calculates mean thickness, thickness range and the standard deviation of thickness across the wafer surface, using processor 712 (FIG. 7). In other embodiments, the mean thickness, thickness range and standard deviation of thickness across the wafer surface are calculated by a central processing unit included in HDP CVD chamber 402 and transmitted to control unit 404, through I/O device 714. Control unit 404 then determines whether the thickness profile of the current wafer is more uniform versus a previous wafer thickness profile, stored in memory 716 (FIG. 7). Based on determinations in control unit 404, control signals are sent to an individual adjustable nozzle 406, using I/O device 714, to change a position of the nozzle, e.g., angle and/or distance, or begin controlling a subsequent nozzle. In other embodiments, control signals are sent to groups of adjustable nozzles 406 to change the positions of the nozzles. Adjustable nozzle 406 is similar to the adjustable nozzle shown in FIG. 3. The deposition process in HDP CVD chamber 402 is repeated with the current position of adjustable nozzle 406, stored in offset adjustment system 720 (FIG. 7). In an embodiment, a control cycle is repeated until a constant thickness profile is obtained. In other embodiments, the control cycle terminates upon developing a thickness profile which satisfies production constraints determined by a process designer. In still other embodiments, the control cycle is continuously repeated to compensate for any dynamic changes within HDP CVD chamber 402.

In the embodiment of FIGS. 5A-5B, control unit 404 (FIG. 4) determines, by execution of one or more sets of instructions, whether the thickness profile is improved using a predetermined thickness range parameter. In step 502, control unit 404 (FIG. 4) calculates the current thickness range based on data provided from HDP CVD chamber 402 (FIG. 4). The thickness range is the difference between the maximum thickness and the minimum thickness measured on the wafer surface. In step 504, current thickness range 722 is compared to reference thickness range 734. In an initial control cycle, reference thickness range 734 is a predetermined maximum value. In subsequent control cycles, reference thickness range 734 is the thickness range of a previous wafer with a film formed in HDP CVD chamber 402 for a given set of nozzle parameters. If the current thickness range 732 is less than or equal to the reference thickness range 734, then the current wafer has either the same or greater thickness uniformity than the predetermined maximum or the previous wafer. If the condition in step 504 is satisfied the process continues to step 506, where memory 716 updates the value of reference thickness range 734 to equal current thickness range 732. Step 506 establishes the basis for testing the thickness profile of a subsequent wafer.

In step 508, control unit 404 (FIG. 4) determines whether a nozzle adjustment type 738 is set to length. Nozzle adjustment type 738 is the type of nozzle positioning currently being controlled. Nozzle adjustment type 738 set to length means distance, d (FIG. 3), is the nozzle position currently being controlled. If control unit 404 determines the nozzle adjustment type 738 is set to length, control 404 increases distance, d (FIG. 3), by one increment in step 510. In an embodiment, one increment is about 0.9 inches. In other embodiments, one increment is greater or less than about 0.9 inches. Memory 716 is configured to store increment value 726. An increment greater than about 0.9 inches will reach a target length after fewer repetitions by feedback control system 400, thereby using fewer test wafers; however, the thickness profile obtained with the larger increment may not be as uniform as with an increment less than about 0.9 inches. After the current distance, d, is determined, a current nozzle position value is stored in step 512. In step 514, a control signal is sent to an adjustable nozzle 406 (FIG. 4) to change the position of the nozzle to the position stored in step 512. In some embodiments, increment value 726 is set at a large value during a control cycle and then reduced to a smaller value after several additional control cycles.

If control unit 404 (FIG. 4) determines the nozzle adjustment type 738 is not set to length, control 404 increases angle, $\theta_n$ (FIG. 3), by one increment in step 516. In an embodiment, one increment is about 3-degrees. In other embodiments, one increment is greater or less than about 3-degrees. Memory 716 is configured to store increment value 726. An increment greater than about 3-degrees will reach a target length after fewer repetitions thereby using fewer test wafers; however, the thickness profile obtained with the larger increment may not be as uniform as with an increment less than about 3-degrees. After the current angle, en, is determined, the value is stored in step 512. In step 514, a control signal is sent to adjustable nozzle 406 (FIG. 4) to change the position of the nozzle to the position stored in step 512. In some embodiments, increment value 726 is set at a large value during a control cycle and then reduced to a smaller value after several additional control cycles.

If control unit 404 (FIG. 4) determines current thickness range 722 is not less than or equal to the reference thickness range 724 in step 504, then the current wafer has lower thickness uniformity than the previous wafer. If the comparison of step 504 is not satisfied, the process continues to step 518. In step 518, control unit 404 determines if nozzle adjustment type 738 is set to length as in step 508. If nozzle adjustment type 738 is set to length, then the nozzle length is decreased by one increment. In an embodiment, one increment is about 0.9 inches. In other embodiments, one increment is greater or less than about 0.9 inches. Distance, d (FIG. 3), is decreased by one increment because the previous wafer had better thickness uniformity than the current wafer, so the nozzle position is restored to the target length. In step 522, target nozzle length 730 is stored in memory 716.

After the length parameter is controlled for a nozzle, control unit 404 (FIG. 4) then sets the nozzle adjustment type 738 to angle in step 524 and begins the process of controlling the angle parameter. In step 526, the reference thickness range 724 is set to a predetermined maximum value to reset the basis for controlling the angle parameter. Control unit 404 then sends a control signal through I/O 714 in step 514 to adjustable nozzle 406 (FIG. 4) to set the nozzle length to target nozzle length 730.

If control unit 404 (FIG. 4) determines nozzle adjustment type 738 is not set to length in step 518, the process continues to step 528. In step 528, the nozzle angle is pivoted back one increment. In an embodiment, one increment is about 3-degrees. In other embodiments, one increment is greater or less than about 3-degrees. Angle, $\theta_n$ (FIG. 3), is decreased by one increment because the previous wafer had better thickness uniformity than the current wafer, so the nozzle position is restored to the target angle. In step 530, target nozzle angle 732 is stored in memory 716. Following step 530, the process sets the nozzle adjustment type 738 to length in step 532. In step 534, reference thickness range 724 is set to a predetermined maximum value. Steps 532 and 534 are to prepare the feedback control system 400 (FIG. 4) to control the next adjustable nozzle 406 (FIG. 4).

In step 536, control unit 404 (FIG. 4) compares current nozzle number 734 to a total number of nozzles 736. The total number of nozzles is the number of adjustable nozzles to be controlled. In an embodiment, the number of adjustable nozzles to be controlled is every nozzle present in the HDP CVD chamber 100 (FIG. 1). In other embodiments, not every adjustable nozzle is controlled. Controlling fewer nozzles results in fewer repetitions of the control cycle and uses fewer wafers, but may not obtain thickness profile uniformity as great as controlling every adjustable nozzle. If current nozzle number 734 is equal to total number of nozzles 736, then the control cycle is complete. If current nozzle number 734 is not equal to total number of nozzles 736 then nozzle number 734 is increased by one in step 538. In step 540, a command to begin controlling the next nozzle is generated. Following step 540, control unit 404 sends a control signal through I/O 714 in step 514 to adjustable nozzle 406 (FIG. 4) to set the nozzle angle to the target angle 732, $\theta_n$ (FIG. 3) and to send the command to begin controlling the next adjustable nozzle.

It was found that by using adjustable nozzles and controlling the position of the adjustable nozzles, the mean thickness of a film deposited on a wafer can be reduced to about 196.1 nm as compared with a mean thickness of about 258.4 nm using conventional techniques. The decrease in mean thickness means less material is being used to create the film and fill the features in the wafer surface, thereby reducing production costs. It was also found that the thickness range decreased from about 3.2% using conventional techniques to about 1.8% using controlled adjustable nozzles. Using controlled adjustable nozzles also reduced standard deviation along the surface from about 6.1% using conventional techniques to about 2.9%. The increased uniformity increases production efficiency because more wafers will pass quality control tests.

One aspect of this description relates to a method of controlling a position of an adjustable nozzle. The method includes depositing a film on a surface of a wafer using a high density plasma chemical vapor deposition (HDP CVD) chamber. The method further includes measuring a thickness profile of the surface of the wafer. The method further includes comparing the measurement of the thickness profile of the surface of the wafer with a reference value using a control unit. The method further includes transmitting a control signal to the adjustable nozzle to alter the position of the adjustable nozzle based on the result of the comparison. The adjustable nozzle includes a base having a hollow center portion for conducting gas, the base configured for connection to a gas source. The adjust nozzle further includes a tip coupled to the base and having an opening formed therein for conducting gas from the base to the exterior of the nozzle, wherein the base is configured for pivoting about a longitudinal axis of the base in response to the control signal. In some embodiments, the method further includes translating the base along the longitudinal axis of the base in response to the control signal. In some embodiments, the method further includes updating, using a feedback control system, the reference value after processing the wafer processed in the HDP CVD chamber. In some embodiments, the method further includes determining, by the HDP CVD chamber, the thickness profile; and transmitting the determined thickness profile to the control unit. In some embodiments, the method further includes determining, by the control unit, the thickness profile based on thickness data received from the HDP CVD chamber. In some embodiments, the HDP CVD chamber houses a plurality of adjustable nozzles. In some embodiments, the method further includes altering, using a feedback control system, the position of some of the plurality of adjustable nozzles to control the thickness profile uniformity. In some embodiments, the method further includes altering, using the feedback control system, the position of each of the plurality of adjustable nozzles to control the thickness profile uniformity.

Another aspect of this description relates to a method of making a semiconductor device. The method includes introducing a gas through an adjustable nozzle into a high density plasma chemical vapor deposition (HDP CVD) chamber. The method further includes depositing a film on a surface of a wafer in the HDP CVD chamber. The method further includes measuring a thickness profile of the surface of the wafer. The method further includes comparing the measurement of the thickness profile of the surface of the wafer with a reference value using a control unit. The method further includes redirecting plasma in the HDP CVD using a baffle. The method further includes dispensing the gas from an adjustable baffle nozzle in the baffle. The method further includes transmitting a control signal to the adjustable nozzle based on the comparison of the thickness profile and the reference value. The method further includes altering a position of a tip of the adjustable nozzle in the HDP CVD in response to the control signal. In some embodiments, the introducing of the gas through the adjustable nozzle includes introducing the gas through the adjustable nozzle. The adjustable nozzle includes a base having a hollow center portion for conducting gas, the base configured for connection to a gas source; and the tip coupled to the base and having an opening formed therein for conducting gas from the base to the exterior of the nozzle, wherein the base is configured for moving relative to a sidewall of the HDP CVD in response to the control signal. In some embodiments, the altering of the position of the tip of the adjustable nozzle includes rotating the adjustable nozzle in an incremental fashion. In some embodiments, the altering of the position of the tip of the adjustable nozzle includes translating the adjustable nozzle in an incremental fashion. In some embodiments, the method further includes storing the position of the tip of the adjustable nozzle. In some embodiments, the altering of the position of the tip of the adjustable nozzle includes translating the adjustable nozzle and rotating the adjustable nozzle.

Still another aspect of this description relates to a method of making a semiconductor device. The method includes introducing a gas through a plurality of adjustable nozzles into a high density plasma chemical vapor deposition (HDP CVD) chamber. The method further includes depositing a film on a surface of a wafer in the HDP CVD chamber. The method further includes measuring a thickness profile of the surface of the wafer. The method further includes comparing the measurement of the thickness profile of the surface of the wafer with a reference value using a control unit. The method further includes transmitting a control signal to at least one adjustable nozzle of the plurality of adjustable nozzles based on the comparison of the thickness profile and the reference value. The method further includes rotating the at least one adjustable nozzle of the plurality of adjustable nozzles in response to the control signal. In some embodiments, the method further includes altering a position of a tip of each adjustable nozzle of the plurality of adjustable nozzles in response to the control signal. In some embodiments, the altering of the position of the tip of each adjustable nozzle includes altering the position of the tip of each adjustable nozzle one at a time. In some embodiments, the method further includes storing a position of a tip of each adjustable nozzle of the plurality of adjustable nozzles following the rotating of the at least one adjustable nozzle. In some embodiments, the method further includes translating the at least one adjustable nozzle in response to the control signal. In some embodiments, the rotating of the at least one adjustable nozzle includes rotating the at least one adjustable nozzle in an incremental fashion.

The above description discloses exemplary steps, but they are not necessarily required to be performed in the order described. Steps can be added, replaced, changed in order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

The invention claimed is:

1. A method of controlling a position of an adjustable nozzle comprising:

depositing a film on a surface of a wafer using a high density plasma chemical vapor deposition (HDP CVD) chamber;

measuring a thickness profile of the surface of the wafer;

comparing the measurement of the thickness profile of the surface of the wafer with a reference value using a control unit; and transmitting a control signal to the adjustable nozzle to alter the position of the adjustable nozzle based on the result of the comparison, wherein the adjustable nozzle comprises:

a base having a hollow center portion for conducting gas, the base configured for connection to a gas source; and a tip coupled to the base and having an opening formed therein for conducting gas from the base to an exterior of the nozzle, wherein the base is configured for pivoting about a longitudinal axis of the base in response to the control signal.

2. The method of claim 1, further comprising translating the base along the longitudinal axis of the base in response to the control signal.

3. The method of claim 1, further comprising updating, using a feedback control system, the reference value after processing the wafer processed in the HDP CVD chamber.

4. The method of claim 1, further comprising determining, by the HDP CVD chamber, the thickness profile; and
transmitting the determined thickness profile to the control unit.

5. The method of claim 1, further comprising determining, by the control unit, the thickness profile based on thickness data received from the HDP CVD chamber.

6. The method of claim 1, wherein the HDP CVD chamber houses a plurality of adjustable nozzles.

7. The method of claim 6, further comprising altering, using a feedback control system, the position of some of the plurality of adjustable nozzles to control the thickness profile uniformity.

8. The method of claim 6, further comprising altering, using a feedback control system, the position of each of the plurality of adjustable nozzles to control the thickness profile uniformity.

9. A method of making a semiconductor device, the method comprising:
introducing a gas into a high density plasma chemical vapor deposition (HDP CVD) chamber;
depositing a film on a surface of a wafer in the HDP CVD chamber;
measuring a thickness profile of the surface of the wafer;
comparing the measurement of the thickness profile of the surface of the wafer with a reference value using a control unit;
redirecting plasma in the HDP CVD using a baffle;
dispensing the gas from an adjustable baffle nozzle in the baffle;
transmitting a control signal to the adjustable nozzle based on the comparison of the thickness profile and the reference value; and
altering a position of a tip of the adjustable nozzle in the HDP CVD in response to the control signal.

10. The method of claim 9, wherein the introducing of the gas through the adjustable nozzle comprises introducing the gas through the adjustable nozzle comprising:
a base having a hollow center portion for conducting gas, the base configured for connection to a gas source; and
the tip coupled to the base and having an opening formed therein for conducting gas from the base to an exterior of the nozzle, wherein the base is configured for moving relative to a sidewall of the HDP CVD in response to the control signal.

11. The method of claim 9, wherein the altering of the position of the tip of the adjustable nozzle comprises rotating the adjustable nozzle in an incremental fashion.

12. The method of claim 9, wherein the altering of the position of the tip of the adjustable nozzle comprises translating the adjustable nozzle in an incremental fashion.

13. The method of claim 9, further comprising storing the position of the tip of the adjustable nozzle.

14. The method of claim 9, wherein the altering of the position of the tip of the adjustable nozzle comprises translating the adjustable nozzle and rotating the adjustable nozzle.

15. A method of making a semiconductor device, the method comprising:
introducing a gas through a plurality of adjustable nozzles into a high density plasma chemical vapor deposition (HDP CVD) chamber;
depositing a film on a surface of a wafer in the HDP CVD chamber;
measuring a thickness profile of the surface of the wafer;
comparing the measurement of the thickness profile of the surface of the wafer with a reference value using a control unit;
transmitting a control signal to at least one adjustable nozzle of the plurality of adjustable nozzles based on the comparison of the thickness profile and the reference value; and
rotating, about a longitudinal axis of the at least one adjustable nozzle, the at least one adjustable nozzle of the plurality of adjustable nozzles in response to the control signal.

16. The method of claim 15, further comprising altering a position of a tip of each adjustable nozzle of the plurality of adjustable nozzles in response to the control signal.

17. The method of claim 16, wherein the altering of the position of the tip of each adjustable nozzle comprises altering the position of the tip of each adjustable nozzle one at a time.

18. The method of claim 15, further comprising storing a position of a tip of each adjustable nozzle of the plurality of adjustable nozzles following the rotating of the at least one adjustable nozzle.

19. The method of claim 15, further comprising translating the at least one adjustable nozzle in response to the control signal.

20. The method of claim 15, wherein the rotating of the at least one adjustable nozzle comprises rotating the at least one adjustable nozzle in an incremental fashion.

* * * * *